United States Patent [19]

Zoccarato et al.

[11] Patent Number: 5,180,985
[45] Date of Patent: Jan. 19, 1993

[54] MULTIPACTOR EFFECT MEASUREMENT DEVICE USING PHASE NOISE

[75] Inventors: Walter Zoccarato, Plaisance du Touch; Théron Bernard, Saint-Orens; Régis Barbaste, Portet, all of France

[73] Assignee: Alcatel Espace, Courbevoie, France

[21] Appl. No.: 717,604

[22] Filed: Jun. 19, 1991

[30] Foreign Application Priority Data

Jun. 22, 1990 [FR] France .............................. 90 07853

[51] Int. Cl.⁵ .......................................... G01R 23/16
[52] U.S. Cl. .................................. 324/613; 328/243; 324/636; 324/639
[58] Field of Search ............... 324/521, 613, 622, 639, 324/462, 460; 328/243

[56] References Cited

U.S. PATENT DOCUMENTS

| | | | |
|---|---|---|---|
| 2,891,217 | 6/1959 | Grieg et al. | |
| 3,265,967 | 8/1966 | Heald | 324/639 |
| 4,578,634 | 3/1986 | Healey | 324/622 |
| 4,714,873 | 12/1987 | McPherson | 324/613 |
| 4,801,861 | 1/1989 | Ashley | 324/613 |
| 4,902,977 | 2/1990 | Kenny | 324/462 |

OTHER PUBLICATIONS

Microwave Journal, Mar. 1978, pp. 77-83; P. F. Clancy: "Multipactor control in microwave space systems".
15th European Microwave Conference, Sep. 9-13, 1985, pp. 483-488, Microwave Exhibitions and Publishers Ltd, Tunbridge Wells, Kent, GB; L.-G. Bernier et al.: "A shifted reference receiver for the measurement of phase noise in microwave amplifiers".

Primary Examiner—Kenneth A. Wieder
Assistant Examiner—Jose M. Solis
Attorney, Agent, or Firm—Sughrue, Mion, Zinn, Macpeak & Seas

[57] ABSTRACT

A device for measuring a multipactor effect in microwave systems includes a first coupler, a vacuum enclosure where a sample under test is enclosed, and a second coupler, all in series between an input which receives incident power and an output which delivers output power. The device also includes a mixer operated as a phase detector having a first input connected to an output of the first coupler to sample part of the input power via a first attenuator and a phase-shifter and a second input connected to an output of the second coupler to sample a part of the output power via a second attenuator. The output of the mixer is connected to a noise measuring device.

4 Claims, 3 Drawing Sheets

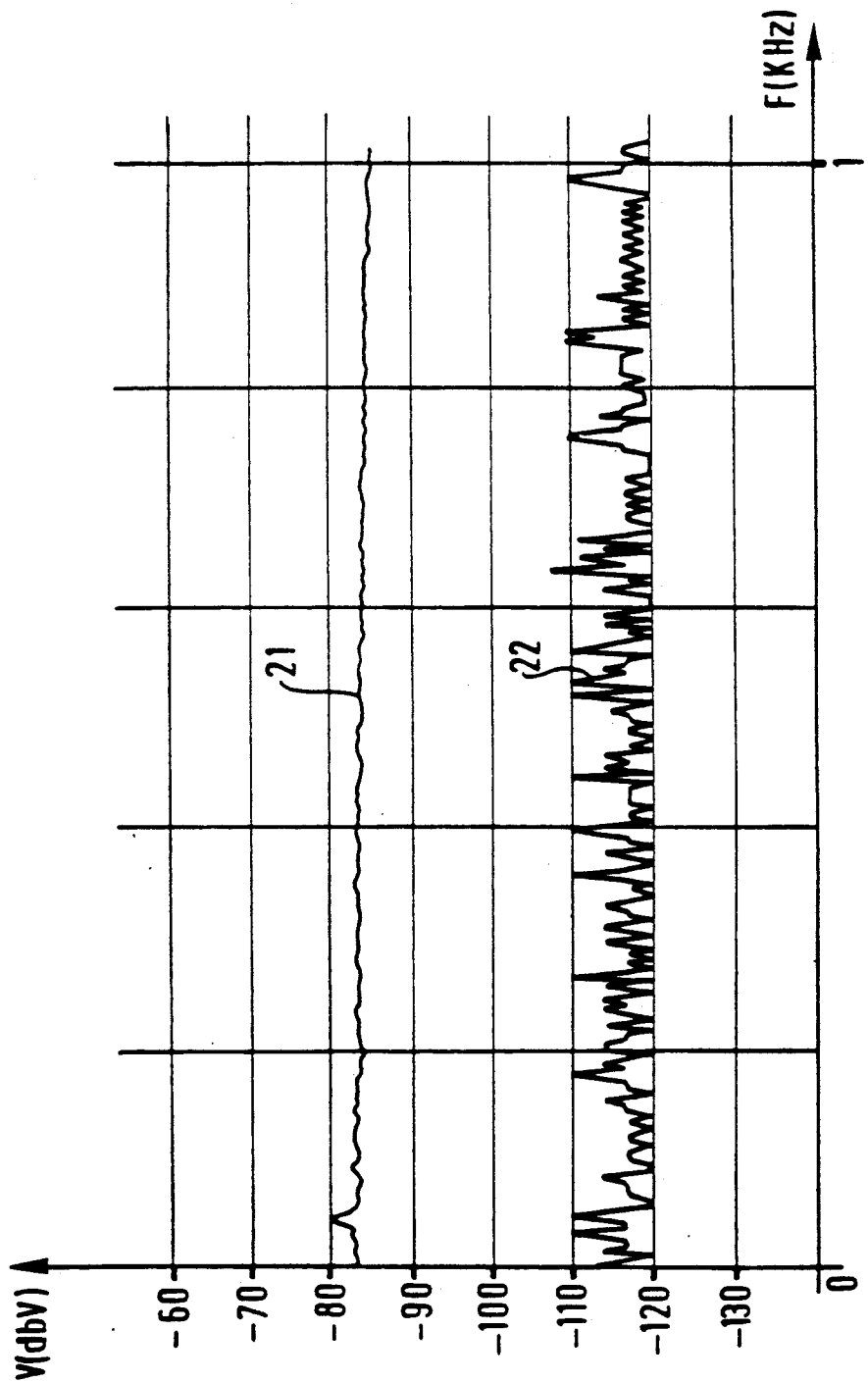

MULTIPACTOR EFFECT MEASUREMENT DEVICE USING PHASE NOISE

BACKGROUND OF THE INVENTION

1. Field of the invention

The present invention concerns a multipactor effect measurement device using phase noise.

2. Description of the prior art

An article by P. F. Clancy entitled "Multipactor control in microwave space systems" published in "Microwave Journal" (March 1978) describes the physical conditions giving rise to multipactor faults in space microwave systems, including power level, frequency band and slot width. On page 82, the article describes measuring the multipactor effect using a noise detection method. The noise is detected at a frequency very near the carrier frequency but not via the phase noise, resulting in a measurement sensitivity problem. The measurement sensitivity depends on:
- the analysis frequency;
- the frequency excursion;
- the analysis band;
- the noise figure of the measuring instruments.

Finally, the resulting figure shows only the reflected power measurement.

An object of the present invention is to solve the aforementioned problem.

SUMMARY OF THE INVENTION

The invention is directed to a device for measuring the multipactor effect comprising.

a first coupler, a vacuum enclosure the device under test where is enclosed and a second coupler in series between an input which receives incident power and an output which delivers output power; and

- a mixer operated as a phase detector having a first input connected to an output of said first coupler to sample part of said input power via a first attenuator and a phase-shifter and a second input connected to an output of said second coupler to sample a part of said output power via a second attenuator, an output of said mixer being connected to a noise measuring device.

The features and advantages of the invention will emerge from the following description given by way of non-limiting example with reference to the corresponding drawings.

BRIEF DESCRIPTION OF THE DRAWINGS

FIG. 3 shows curves illustrating the operation of the device in accordance with the invention.

DETAILED DESCRIPTION OF THE INVENTION

Figure 1:
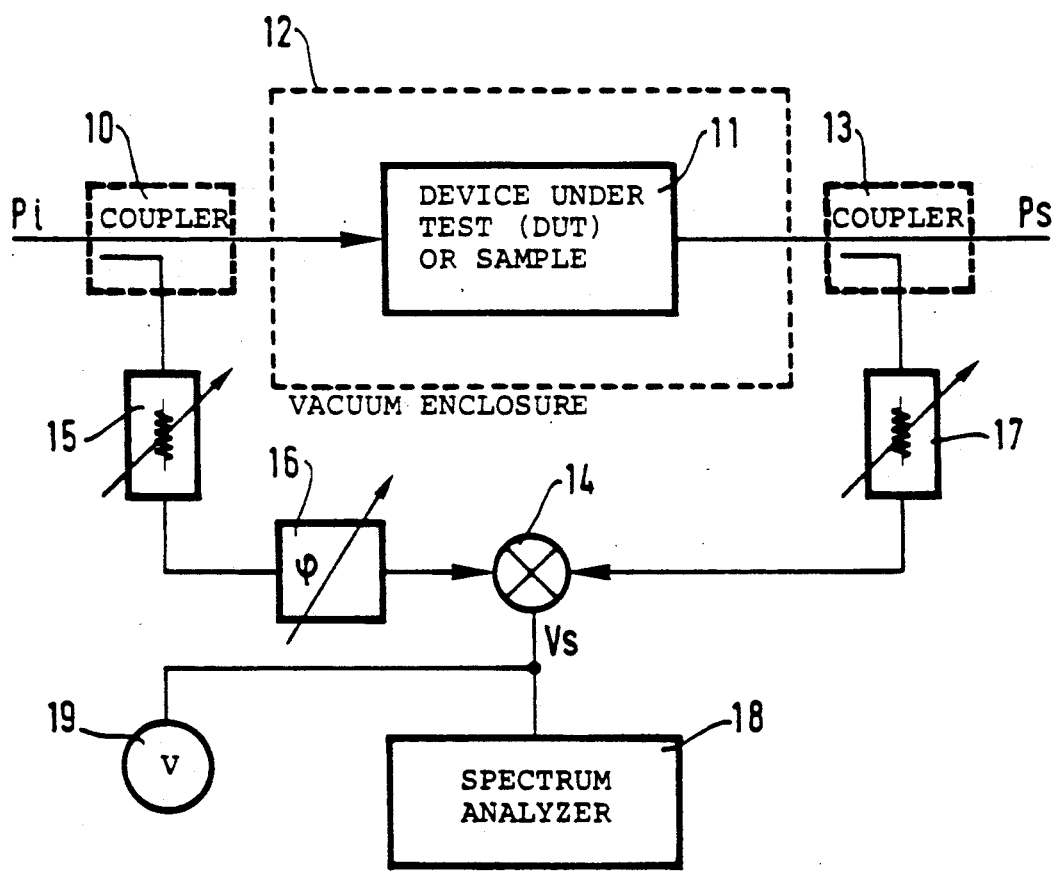
FIG. 1 shows a device in accordance with the invention.

The invention is directed to a multipactor effect measurement device using phase noise, as shown in FIG. 1.

The device comprises a first coupler 10, a vacuum enclosure 12 where the device or sample 11 under test is disposed, and a second coupler 13;

in series between an input which receives the incident power Pi and an output which delivers the output power Ps; and a mixer 14 operating as a phase detector which has its first input connected to an output of the first coupler 10 to sample part of the incident power Pi via a first attenuator 15 and a phase-shifter 16 and second input connected to an output of the second coupler 13 to sample part of the output power Ps via a second attenuator 17; its output Vs is connected to a spectrum analyzer 18 and a voltmeter 19.

A measuring device in accordance with the invention samples part of the input signal (Pi) and the output signal (Ps) of the measurement device 11, the variable attenuators 15 and 17 reducing the sampled levels to values compatible with the mixer 14, the variable phase-shifter 16 being included in one of these two channels. The mixer 14 receives two signals on its local oscillator and RF channels and functions as a phase detector. The mixer output (IF) is connected to the low-frequency (a few Hz to a few MHz) spectrum analyzer 18. The voltmeter 19 measures the DC voltage at the output of the mixer 14.

To carry out the measurement, the variable attenuators 15 and 17 are adjusted to obtain output levels compatible with the operation of the mixer 14 as a phase comparator. The variable phase-shifter 16 is then adjusted until a null DC voltage is obtained at the output of the mixer 14.

When the multipactor effect occurs in the device under test it induces phase noise into the passing signal which results in a very strong increase in the noise level measured at the low-frequency spectrum analyzer 18.

The low-frequency spectrum analyzer 18 can be replaced by any other device measuring the noise level in the frequency range from approximately 1 Hz to 1 MHz. The spectrum analyzer or the noise measuring set may be preceded if necessary by a low-noise amplifier to increase measurement sensitivity.

The phase-shifter 16 included in one branch of the mixer 14 is used to select the most sensitive range of the mixer, for example by using the voltmeter 19 to obtain a null Vs signal.

The low-frequency spectrum analyzer 18 measures the phase noise at a frequency very near the carrier frequency in a narrow band running from a few Hz to a few kHz (maximum) about the zero point.

Figure 2:
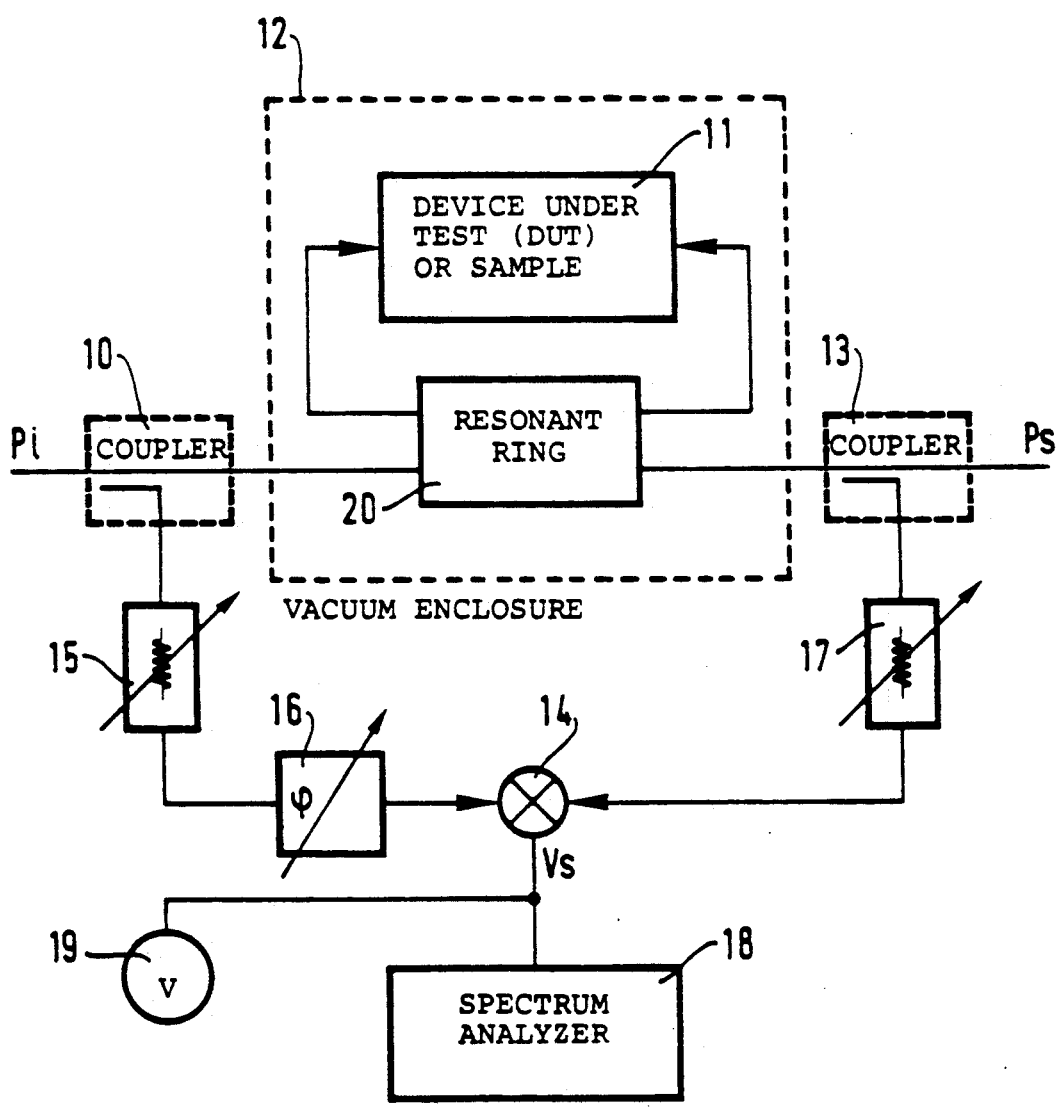
FIG. 2 shows an alternative embodiment of the device in accordance with the invention.

An alternative embodiment of the device in accordance with the invention shown in FIG. 2 includes a resonant ring 20 (well known in the art) formed by a looped line resonating at a given frequency to provide gain.

The operation of this embodiment is the same as the operation of that shown in FIG. 1 except that the properties of the resonant ring 20 make it possible to reach powers much greater than the incident power and which depend on:
- the losses of the device under test;
- the losses of the resonant ring;
- the coupling to the main line;
- the losses of the coupler.

The multipactor effect is again measured at low power.

The energy stored in the resonant ring 20 is used to obtain a power approximately equal to the incident power augmented by the coupling due to the ring 20, if the device under test is characterized by low losses ($\leq 0.1$ dB). It is possible in this way to achieve a gain in the order of 10 dB which, for an incident power of 500 W, makes it possible to achieve a sample power in the order of 5,000 W. Another advantage of the ring 20 is that the power in the ring is independent of the phase such that all points of the sample under test are subject to the same power. To increase or decrease the resonant frequency it is sufficient to decrease or increase the length of the ring.

With a sample 11 under test in the form of a section of reduced height (0.1 mm) waveguide, the curves of the detected noise level as a function of the frequency F with (21) or without (22) the multipactor effect recorded on the spectrum analyzer 18 are as shown in FIG. 3.

The curve 22 is measured with no multipactor effect and the curve 21 is measured when this effect is triggered. This curve has a mean level of around 40 dBV relative to the noise (curve 22) and was obtained under the following measurement conditions:
- $P_i = 55$ to 58 dBm,
- coupler attenuation = 50 dB,
- maximum mixer input power = +8 dB,
- frequency = 11 GHz,
- phase noise level = −83 dB,
- reference level = −120 dBV,
- measurement frequency = 1 kHz,
- measured voltage (voltmeter) = 0 V.

It is to be understood that the present invention has been described and shown by way of example only and that some component parts thereof can be replaced by equivalent parts without departing from the scope of the invention.

I claim:

1. An apparatus for measuring a multipactor effect comprising:
    a series connection of a first coupler, a vacuum enclosure where a device under test is enclosed, and a second coupler, said series connection being coupled between an input which receives incident power and an output which delivers output power; and
    a mixer operated as a phase detector having a first input connected to an output of said first coupler to sample part of said input power via a first attenuator and a phase-shifter and a second input connected to an output of said second coupler to sample a part of said output power via a second attenuator, an output of said mixer being connected to a noise measuring device.

2. The apparatus according to claim 1 comprising a resonant ring providing an interface to the device under test.

3. The apparatus according to claim 1 wherein said noise measuring device is a low-frequency spectrum analyzer.

4. The apparatus according to claim 1 comprising a low-noise amplifier between said mixer and said noise measuring device.

* * * * *